(12) United States Patent
Rotsch

(10) Patent No.: US 7,307,715 B2
(45) Date of Patent: Dec. 11, 2007

(54) METHOD FOR THE FORMATION OF A STRUCTURE SIZE MEASURED VALUE

(75) Inventor: Christian Rotsch, München (DE)

(73) Assignee: Infineon Technologies AG, Munich (DE)

( * ) Notice: Subject to any disclaimer, the term of this patent is extended or adjusted under 35 U.S.C. 154(b) by 185 days.

(21) Appl. No.: 11/112,748

(22) Filed: Apr. 22, 2005

(65) Prior Publication Data

US 2005/0237542 A1    Oct. 27, 2005

(30) Foreign Application Priority Data

Apr. 23, 2004   (DE) ...................... 10 2004 020 657

(51) Int. Cl.
*G01J 1/10* (2006.01)

(52) U.S. Cl. .................... 356/243.1; 356/388; 356/397

(58) Field of Classification Search ............ 356/243.1, 356/388–389, 394–401
See application file for complete search history.

(56) References Cited

U.S. PATENT DOCUMENTS 5,838,434 A * 11/1998 Skramsted et al. ...... 356/241.1
6,459,482 B1 * 10/2002 Singh et al. ............. 356/243.1
6,570,157 B1 * 5/2003 Singh et al. ................ 250/311
6,628,409 B2    9/2003 Rotsch
2004/0153667 A1    8/2004 Kastelewicz et al.

FOREIGN PATENT DOCUMENTS

| DE | 100 58 216 C1 | 6/2002 |
| DE | 101 15 888 A1 | 10/2002 |
| DE | 102 23 248 A1 | 12/2003 |

* cited by examiner

*Primary Examiner*—Hwa (Andrew) Lee
*Assistant Examiner*—Tara S. Pajoohi
(74) *Attorney, Agent, or Firm*—Slater & Matsil, L.L.P.

(57) ABSTRACT

The structure size of a structure (100) is measured by forming an auxiliary measured value (Dx', Dy'). A calibration measured value (Px', Py') is determined on the basis of a calibration structure (110), which comprises at least two structure elements (140) at a distance from one another, including at least the measured value sum of the width (By') of one of the two structure elements (140) and the distance (Ay') between the two structure elements (140). The calibration measured value (Px', Py') and a predetermined calibration preset value (Px, Py), which relates to the calibration structure (110), result in the determination of a calibration factor (C, Cx, Cy). The auxiliary measured value (Dx', Dy') is corrected using the calibration factor (C, Cx, Cy) in order to form the structure size measured value (Dx,k; Dy,k).

23 Claims, 3 Drawing Sheets

METHOD FOR THE FORMATION OF A STRUCTURE SIZE MEASURED VALUE

This application claims priority to German Patent Application 102004020657.0, which was filed Apr. 23, 2004 and is incorporated herein by reference.

TECHNICAL FIELD

The invention relates to a method for the formation of a structure size measured value, which indicates the structure size of a structure that is arranged on a mask or on a substrate, in particular on a semiconductor wafer.

BACKGROUND

Structures on masks or substrates are normally measured using mask or wafer structure size test sets (for example CD-SEMs (SEM: Scanning Electron Microscopy)). In the previously normal measurement methods, the measurement accuracy (performance or test equipment capability) of the test set is determined and adjusted regularly with the aid of a specific calibration measurement. The calibration measurement is carried out independently of and separately from the actual measurement on the product, that is to say on the mask or on the substrate. Calibration measurements such as these may be a part of an SPC method (SPC: Static Process Control). In the already known calibration methods, measurement error limits are preset, which the mask or wafer structure size test set must not exceed. If the mask or wafer structure size test set nevertheless exceeds the measurement error limit, then the test set is recalibrated. Recalibration is thus carried out only when a predetermined error limit is exceeded; a certain residual error up to a predetermined maximum size is thus permissible. These "permissible" residual errors in the already known measurement methods are included directly in the structure size measurement of the structures located on the product (mask or substrate).

SUMMARY OF THE INVENTION

In one aspect, the invention specifies a method for the formation of a structure size measured value that has particularly good measurement accuracy.

According to embodiments of the invention, the structure size of a structure is measured by forming an auxiliary measured value (Dx', Dy'). A calibration measured value (Px', Py') is determined on the basis of a calibration structure, which comprises at least two structure elements at a distance from one another, including at least the measured value sum of the width (By') of one of the two structure elements and the distance (Ay') between the two structure elements. The calibration measured value (Px', Py') and a predetermined calibration preset value (Px, Py), which relates to the calibration structure, result in the determination of a calibration factor (C, Cx, Cy). The auxiliary measured value (Dx', Dy') is corrected using the calibration factor (C, Cx, Cy) in order to form the structure size measured value (Dx,k; Dy,k).

Embodiments of the invention accordingly provide that, in order to form a structure size measured value, the structure size of the structure to be measured (that is to say the useful structure or main structure) is first of all measured, with an auxiliary measured value being formed. A calibration measured value is then measured on the basis of a calibration structure, which is located, for example, on the mask or on the substrate. This calibration structure may be a structure in addition to the "structure to be measured" or else may be part of the structure to be measured. According to the invention, the calibration structure has at least two structure elements that are at a distance from one another, with at least the sum of the width of one of the two structure elements and the width of the distance between the two structure elements being included in the calibration measured value. A calibration factor is then determined using the calibration measured value and a calibration preset value, which relates to the respectively used calibration structure. This calibration factor is then used to correct the measured auxiliary measured value, with the structure size measured value being formed.

The basic idea of the method according to the invention is to carry out a calibration on the basis of a calibration structure that has at least two structure elements that are arranged at a distance from one another. According to embodiments of the invention, the calibration measured value includes at least the sum of the width of one of the two structure elements and the width of the distance between the two structure elements. This is because, if production fluctuations occur on the mask to be measured or on the substrate to be measured in the course of the production of the structure to be measured, and these production fluctuations relate to the structure width of the structure to be measured, then the calibration structure will also be affected at the same time to a corresponding extent.

The inventors have identified the fact that the structure elements of the calibration structure on its own would be unsuitable for calibration of the test set used since they are also subject to the production tolerances during structure production—like the structures to be measured (the actual "main structures"). In order to allow the test set to be calibrated despite this, the width of the distance between the two structure elements of the calibration structure is also taken into account in the calibration measured value since, as the inventors have found, the structure size changes which occur when production tolerances occur are correlated with distance changes which likewise occur. Specifically, if the structure elements of the calibration structure become broader as a result of the production techniques, the distance between the structure elements is reduced, so that the sum of the width values of the structure element and the distance remains approximately constant.

In a corresponding manner, if the width of the structure elements decreases, the distance between the structure elements becomes greater, so that the sum of the width values remains approximately constant in this case as well. If the sum of the width value of one of the structure elements and the width value of the distance to the respectively adjacent structure element is now used as the calibration measured value, then this calibration measured value will be largely constant and independent of the production tolerances. If the calibration measured value is now largely uninfluenced by the production tolerances that occur, then, in consequence, it would always have to correspond to a predetermined calibration preset value, which relates to the respective calibration structure. Only if a measurement error occurs in the test set that is used for the measurement is it possible for the calibration measured value to differ from the predetermined calibration preset value.

Any discrepancy between the calibration measured value and the calibration preset value thus defines a measurement error in the test set which must be "recalibrated" in the course of a calibration process. This "recalibration" is carried out by determining a calibration factor, which represents a measure of the measurement error, using the measured calibration measured value and the predetermined calibration preset value—for example by forming the quotient—and by then correcting the auxiliary measured value using the calibration factor, in order to form the sought structure size measured value—for example by multiplication.

One advantage of the method according to various embodiments of the invention is that this method allows correction of the measured values and/or recalibration of the test set used to be carried out directly on the basis of calibration structures that are provided on the specific product, that is to say the mask to be measured and/or the substrate to be measured. The method according to the invention, therefore, means that there is no need to first of all separately precalibrate the test set used. In other words, with the method according to the invention, the test set used is calibrated and the actual measurement of structures are carried out separately in a single step, and no longer—as already known—at different times. "Raw measured values" are thus not used, as in the past, in order to form structure size measured values that are measured using a test set that has been calibrated as well as possible. Instead of this, with the method according to the embodiments of invention, a calibration factor is also determined during the measurement of the structures on the mask or on the substrate in addition to the "raw measured values", and this calibration factor is used to correct the "raw measured values" such that the resultant measurement error of the structure size measured value is minimal.

A further advantage of the method according to embodiments of the invention is that this method can also be carried out using test sets that are subject to relatively large errors, since the measurement errors that occur are subsequently corrected.

In some embodiments, the invention is suitable for a large number of test sets and measurement methods, for example for CD-SEM methods, scanning electron microscopy methods, for example AFM methods (AFM: Atomic Force Microscope), ellipsometer (scatterometry) methods and optical microscopy methods.

In order to reduce measurement errors resulting from any structure size dependency of the measurement method (nonlinear measurement response), it is regarded as being advantageous to record calibration measured values for a large number of calibration structures of different size, and to use these to form the structure size measured values. For example, the calibration measured value for that calibration structure, which is most similar in terms of size to the structure to be measured, can still be used in each case. Alternatively, the calibration measured values can be averaged; the structure size measured values for the structure to be measured are then formed, for example, using the mean value of the calibration measured values.

The measurement method may be used, for example, for measurement of structures that have been produced using an additional production mask on the substrate to be measured or on the mask to be measured. The calibration preset value is preferably determined on the basis of the production mask by measuring the calibration structure, which is likewise present on the production mask and by continuing to use the resultant measured value as the calibration preset value.

The measurement accuracy for the formation of the structure size measured value can effectively be increased as required provided that the calibration factor is determined appropriately accurately. This can be achieved particularly easily, and thus advantageously, by measuring a large number of calibration structures in order to form a large number of individual calibration factors, by averaging the individual calibration factors formed in this way, and by continuing to use the resultant mean value as the calibration factor for correction of the structure size measured value.

By way of example, a grid structure with at least two parallel grid bars, which each form one structure element (for example grid lines or grid rods), is particularly suitable as a calibration structure.

Furthermore, the "measurement direction"—that is to say, for example, the x or y direction of the mask or of the substrate—to which the calibration factor relates, can be taken into account when carrying out the method. This can be carried out particularly easily and thus advantageously by determining the calibration factor for a predetermined measurement direction, and by correcting the auxiliary measured value exclusively for structures that extend along the predetermined measurement direction. When a grid structure is used as the calibration structure, the predetermined measurement direction preferably runs at right angles to the longitudinal direction of the grid bars of the grid structure.

One particularly advantageous development of the method according to embodiments of the invention provides for a specific calibration factor to be determined for each of at least two different measurement directions, and for the auxiliary measured value to be corrected taking account of the at least two calibration factors. By way of example, this is done by determining the amount by which the structure to be measured extends along the different measurement directions, and by applying the associated calibration factors appropriately. If measurements are carried out in two measurement directions, the measurement directions are preferably at right angles to one another. If three or more measurement directions are used, these are preferably arranged symmetrically (for example symmetrically about a point).

One individual calibration structure is preferably in each case used for each of the measurement directions in order to make it possible to determine separate calibration factors for each of the measurement directions. One individual grid structure having in each case at least two parallel grid bars, which each form a structure element, is preferably in each case used for each of the measurement directions. If two measurement directions, which are arranged at right angles to one another are used, the grid structures are preferably at right angles to one another. The measurement direction in each case runs transversely with respect to the longitudinal direction of the grid bars of the associated grid structure.

If the calibration preset value is measured using a first test set, and the auxiliary measured value and the calibration measured value are measured using a second test set, it is regarded as being advantageous for the first test set to have particularly good measurement accuracy, preferably to have a better measurement accuracy than the second test set, in order to ensure that the calibration factor, which directly determines the measurement accuracy of the structure size measured value that is formed has the maximum accuracy. The two test sets may, apart from this, operate using different measurement methods.

Alternatively, the calibration preset value may also be predetermined and fixed. In a situation such as this, the "nominal value" of the calibration structure is preferably chosen as the calibration preset value. The maintenance of the "nominal value" is preferably monitored using a very accurate measurement method.

Furthermore, the invention also relates to a test set for the formation of a structure size measured value, which indicates the structure size of a structure that is arranged on a mask or on a substrate, in particular on a semiconductor wafer.

In this context, the invention is based on the object of specifying a test set that achieves particularly good measurement accuracy.

Advantageous refinements of the test set according to the invention are specified in dependent claims.

BRIEF DESCRIPTION OF THE DRAWINGS

The invention will be explained in the following text using, by way of example, three figures, in which.

The same reference symbols are used for identical or comparable components in FIGS. 1 to 3.

Figure 1:
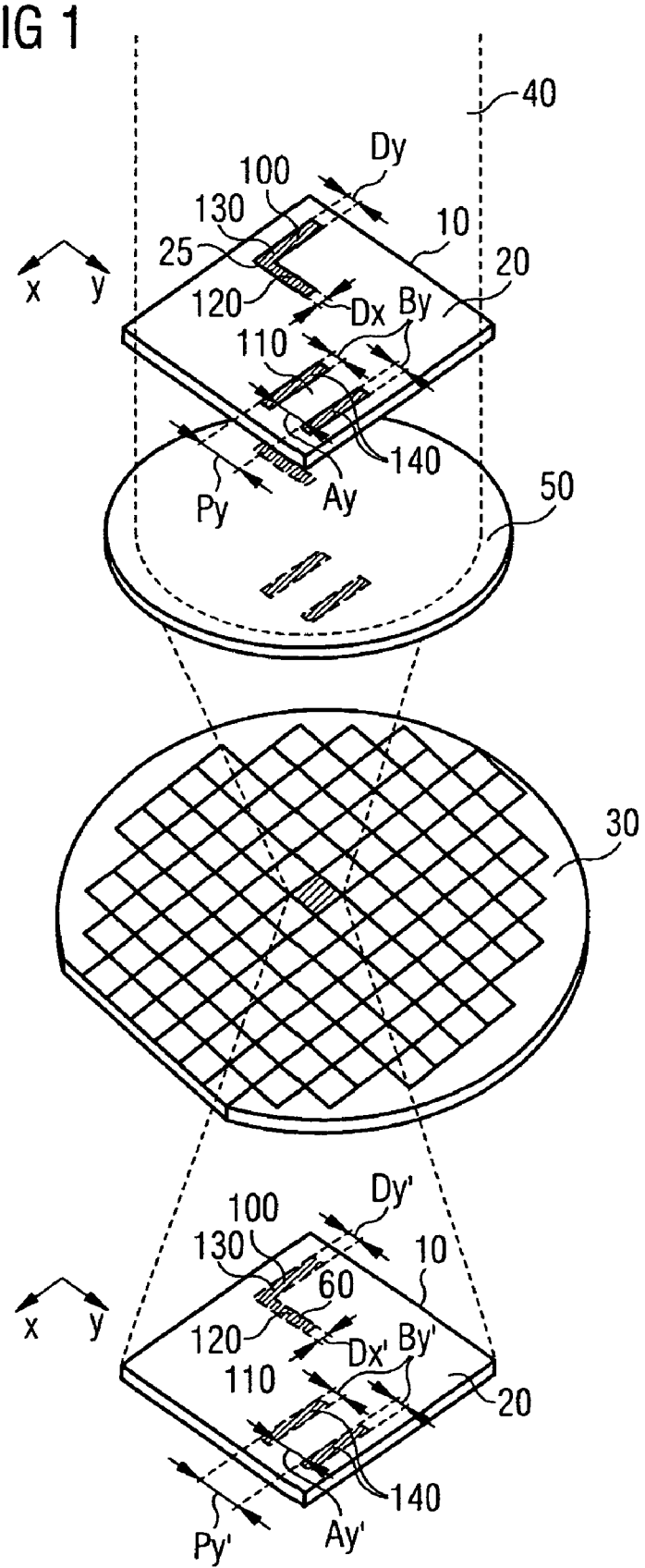
FIG. 1 shows one exemplary embodiment of the method according to the invention, in which a direction-independent correction factor is taken into account.

The following list of reference symbols can be used in conjunction with the figures
10 Mask
20 Mask layout
25 Photoresist structure
30 Wafer
40 Light beam
50 Focusing lens
60 Resultant photoresist structure
100 Useful structure
110 Calibration structure
120 Bar
130 Bar
140 Calibration bar
200 Grid structure
210 Grid structure
220 Grid bar
300 Test set
310 Measurement unit
320 Control device
330 Microprocessor
340 Memory

DETAILED DESCRIPTION OF ILLUSTRATIVE EMBODIMENTS

FIG. 1 illustrates a lithography process. The figure shows a mask 10 with a mask layout 20, which is intended to produce a desired photoresist structure 25 on a wafer 30, for example a silicon wafer. A light beam 40 passes through the mask 10 and a downstream focusing lens 50, and falls on the wafer 30, so that the mask layout 20 is imaged on the wafer 30, which is coated with photoresist. Production errors and production tolerances result in imaging errors, with the consequence that the resultant photoresist structure 60 on the wafer 30 in some cases differs not inconsiderably from the mask layout 20 and thus from the desired photoresist structure 25. The resultant photoresist structure on the wafer 30, which is annotated with the reference symbol 60, is shown enlarged, and schematically underneath the wafer 30, in FIG. 1 in order to illustrate it better.

As can be seen from FIG. 1, the mask layout 20 has a useful structure and a calibration structure. The useful structure is annotated in FIG. 1 by the reference symbol 100, and the calibration structure is annotated with the reference symbol 110. The useful structure 100 is formed, for example, by two bars 120 and 130 (and/or strips or lines), which are arranged at right angles to one another. The bar 130, which extends in the x direction, has a bar width Dy (in the y direction); the bar width of the bar 120, which extends in the y direction is annotated Dx, since its width extends in the x direction.

The calibration structure 110 includes two parallel calibration bars 140, which each form one structure element, are at a distance of Ay from one another, and form a grid structure. The bar width of the two calibration bars 140 is annotated By.

As can be seen from FIG. 1, production errors and production tolerances in the lithography process result in imaging errors: for example, the useful structure 100 and the calibration structure 110 are narrower than desired in the resultant photoresist structure 60. The bar 130, which extends in the x direction has a bar width Dy'; the bar width of the bar 120, which extends in the y direction is Dx'. In a corresponding manner, the two calibration bars 140 are also narrower, and the bar width is only By'.

If the resultant widths of the two bars 120 and 130 of the useful structure 100 in the resultant photoresist structure 60 are now measured using a mask or wafer structure size test set, then it is possible to detect the described imaging error. However, any unavoidable measurement error from the test set in this measurement will corrupt the measurement result. The following procedure is adopted in order to preclude this measurement error, or at least to reduce it.

First of all, the calibration structure 110 on the mask 10 is measured using a particularly accurate test set, referred to in the following text as the "first test set"—for example a scanning electron microscope. Specifically, the so-called "pitch" Py of the calibration structure 110 is recorded. The pitch is defined by the sum of the measured values of the width By of one of the two calibration bars 140 and the measured value of the distance Ay between the two calibration bars 140. Thus:

$$Py = Ay + By$$

The pitch Py is still used as the calibration preset value from then on.

The resultant widths of the two bars 120 and 130 of the useful structure 100 in the resultant photoresist structure 60 are then measured using the mask or wafer structure size test set which has already been mentioned above—and is referred to for short in the following text as the second test set. This results in the measured values Dy' and Dx'. The second test set is also used to measure the pitch Py' of the calibration structure 110 in the resultant photoresist structure 60. The pitch Py' is also referred to in the following text as the "calibration measured value".

The stated measured values will be corrupted by any measurement error from the second test set. This measurement error can, however, be corrected since imaging errors, which occur in an imaging method or lithography method, leave the pitch Py effectively unchanged. Thus, approximately:

$$Py = Py'$$

This can obviously be explained by the fact that, as the two calibration bars 140 "become narrower" as a result of lithography errors, the distance Ay between the calibration bars becomes larger, so that the pitch Py remains approximately the same. In a corresponding manner, the distance Ay becomes smaller when the two calibration bars 140 become broader as a result of lithography errors.

If it is now found using the second test set that the pitch Py' in the resultant photoresist structure 60 differs from the pitch Py on the mask 10, then this must be mainly due to a measurement error in the second test set, since the first test set is very accurate. In order to correct this measurement error, a calibration factor C is formed using the pitch Py' (calibration measured value) from the second test set and the pitch Py (calibration preset value) from the first, very accurate test set, as follows:

$$C=Py/Py'$$

This calibration factor C is used to correct the measured values from the second test set, using:

$$Dy,k=Dy'*C$$

$$Dx,k=Dx'*C$$

where Dy,k and Dx,k denote the corrected measured values, and thus the "correct" or error-free structure size measured values for the useful structure 100. The measured values Dy' and Dx' thus represent only auxiliary measured values, by means of which the actual structure size measured values Dy,k and Dx,k of the useful structure 100 are determined.

By way of example, the exemplary embodiment shown in FIG. 1 has been based on the assumption that the mask layout 20 is imaged on the wafer 30 to a scale of 1:1.

Alternatively, a different imaging ratio A may also be set, for example an imaging ratio of 5:1 (A=5); this means that the mask structure 20 is five times larger than the resultant photoresist structure 60. The imaging ratio A must be taken into account in an appropriate form in the above "calibration formulae". Thus:

$$Py=Ay+By$$

$$Py'=Ay'+By'$$

$$Py=A*Py'$$

$$C'=Py/(A*Py')$$

$$Dy,k=Dy'*C'$$

$$Dx,k=Dx'*C'$$

Apart from this, the calibration factor C or C' can also be determined exclusively by measurements on the wafer 30. If, for example, the pitch in the resultant photoresist structure 60 is measured using a very accurate test set, then this results in a measured value that is referred to in the following text as the pitch Py''. The pitch Py' is measured using the second, possibly inaccurate, test set, as explained above. Thus, if the second test set "has no measurement error":

$$Py''=Py'$$

Discrepancies in the pitch Py' are thus caused by measurement errors in the second test set. A calibration factor C'' can now be determined using the two pitch values Py' and Py'':

$$C''=Py''/Py'$$

The corrected measured values and thus the "correct" or error-free structure size measured values Dy,k and Dx,k of the useful structure 100 are then calculated using this calibration factor C'':

$$Dy,k=Dy'*C''$$

$$Dx,k=Dx'*C''$$

Structure size measured values can also be measured in a corresponding manner on the mask layout 20 of the mask 10 by using a first, very accurate test set to measure the calibration structure 110 on the mask layout 20 and by using the resultant measured values for calibration of a second test set, which is less accurate than the first test set. The useful structure 100 in the mask layout 20 is then measured "calibrated" using the second test set.

The calibration structure 110 in the exemplary embodiment shown in FIG. 1 is provided in the mask layout 20; alternatively, the calibration structure 110 may also be arranged separately from the mask 10, for example in the area of the measurement arrangement, and thus in the area of the test sets used.

A second exemplary embodiment of the method according to the invention will be explained in the following text with reference to FIG. 2.

Figure 2:
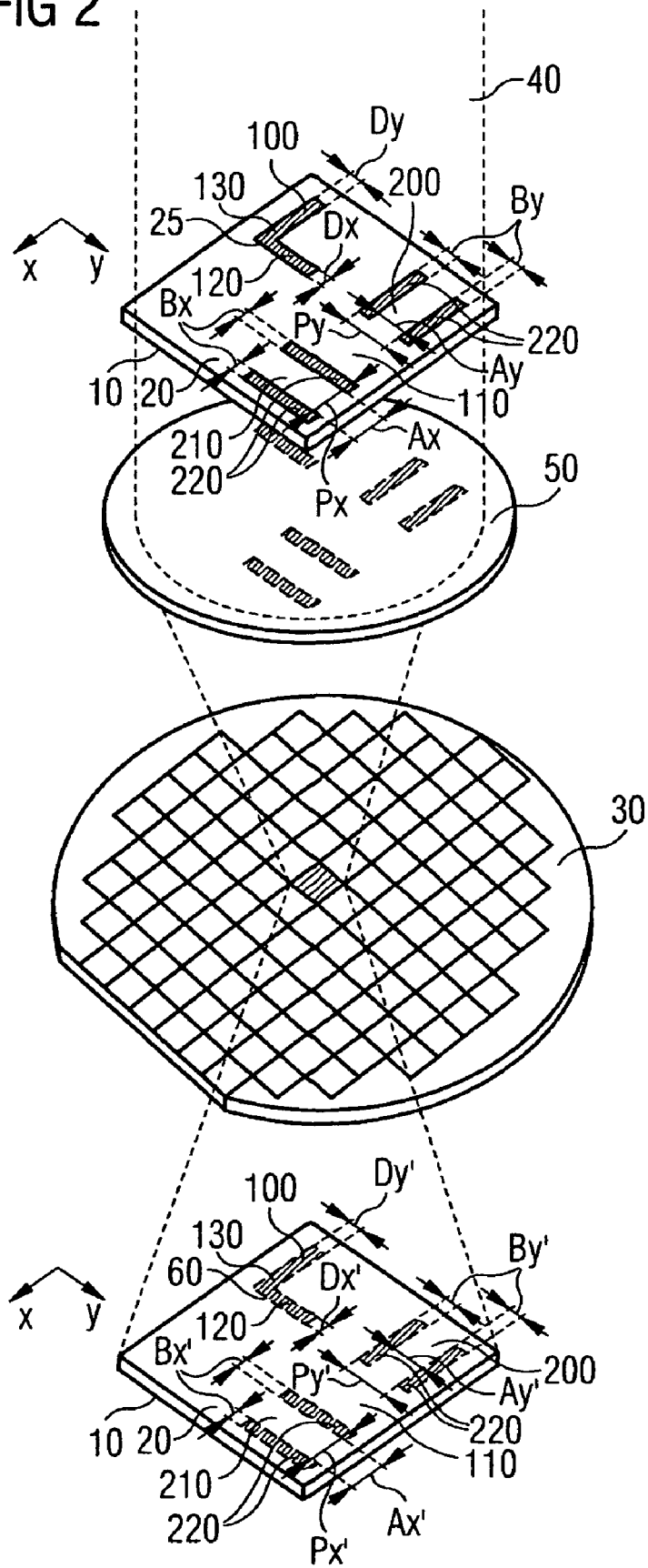
FIG. 2 shows a second exemplary embodiment of the method according to the invention, in which two direction-dependent correction factors are used.

As can be seen from FIG. 2, the mask layout 20 has a useful structure 100 and a calibration structure 110. The calibration structure 110 contains two grid structures 200 and 210. In the first grid structure 200, the grid rods 220 extend in the x direction, and their width extends in the y direction. In the second grid structure 210 the grid rods 220 extend in the y direction, and their width extends in the x direction.

First of all, the two grid structures 200 and 210 on the mask 10 are measured using a particularly accurate first test set. This is used to find the "pitch" values Px and Py, as follows:

$$Py=Ay+By$$

$$Px=Ax+Bx$$

The two pitch values Px and Py are used from then on as calibration preset values.

The useful structure 100 in the resultant photoresist structure 60 is then measured using the already mentioned second test set. This results in the measured values Dy' and Dx'. The second test set is also used to measure the pitch values Px' and Py' of the calibration structure 110 in the resultant photoresist structure 60. The pitch values Px' and Py' are also referred to in the following text as "calibration measured values".

Any measurement error in the second test set results in its measured values being corrupted. In order to correct this measurement error, calibration factors Cx and Cy are formed using the pitch values Px' and Py' (calibration measured values) from the second test set, and the pitch values Px and Py (calibration preset values) from the first, very accurate test set:

$$Cx=Px/Px'$$

$$Cy=Py/Py'$$

These calibration factors Cx and Cy are used to correct the measured values from the second test set, as follows:

$$Dy,k=Dy'*Cy$$

$$Dx,k=Dx'*Cx$$

where Dy,k and Dx,k denote the corrected measured values and thus the "correct" or error-free structure size measured values of the useful structure 100 in the resultant photoresist structure 60. The correction process is thus carried out differently in the x direction and y direction. This makes it possible to take account of the fact that the second test set may have different errors in the x direction and the y direction.

The measured values Dy' and Dx' thus represent only auxiliary measured values, which are used to determine the actual structure size measured values Dy,k and Dx,k of the useful structure 100 in the resultant photoresist structure 60.

Figure 3:
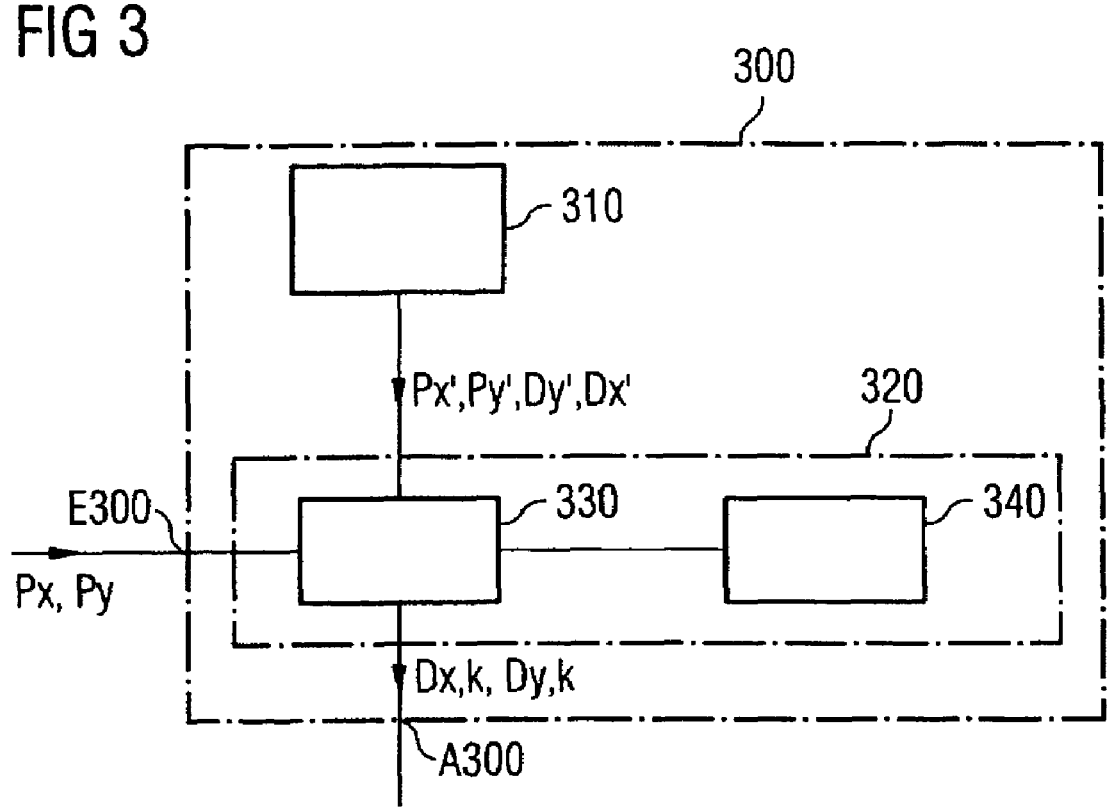
FIG. 3 shows one exemplary embodiment of a test set according to the invention for carrying out the method according to the invention.

FIG. 3 shows one exemplary embodiment of a test set 300, which can be used as the "second" test set for the purposes of the method as explained in conjunction with FIGS. 1 and 2.

The figure shows a measurement unit 310 and a control device 320 that is connected to the measurement unit 310. The control device 320 has a microprocessor 330 and a memory 340, in which a control program for carrying out a measurement method is stored. The control program operates as explained in conjunction with FIGS. 1 and 2.

The test set also has an input E300, at which calibration preset values Px, Py from another test set—for example the "first" test set, which has been explained in conjunction with FIGS. 1 and 2—can be fed in.

The microprocessor 330 calculates measured values Dx,k and Dy,k, which have been corrected using the calibration preset values Px, Py supplied on the input side, using the auxiliary measured values Dy' and Dx' as measured using the measurement unit 310 on the resultant photoresist structure 60, and using the calibration measured values Px' and Py' as measured by the measurement unit 310 on the resultant photoresist structure 60—in the manner described in conjunction with FIGS. 1 and 2; the corrected measured values Dx,k and Dy,k are emitted as structure size measured values at an output A300 of the test set 300.

What is claimed is:

1. A method of processing a workpiece, the method comprising:
   providing a workpiece that includes a structure that has a structure size, the workpiece comprising a mask or a substrate;
   measuring the structure size of the structure to determine an auxiliary measured value;
   determining a calibration measured value on the basis of a calibration structure, the calibration structure including at least two structure elements at a distance from one another, the calibration measured value based on at least a measured value sum of the width of one of the two structure elements and a distance between the two structure elements;
   determining a calibration factor based on the calibration measured value and a predetermined calibration preset value that relates to the calibration structure;
   correcting the auxiliary measured value using the calibration factor thereby determining the structure size measured value; and
   evaluating the workpiece based upon the structure sized measured value;
   wherein a calibration factor is determined for each of at least two different measurement directions; and
   wherein the auxiliary measured value is corrected taking account of the determined calibration factors and taking into account the amount by which the structure to be measured extends along the different measurement directions.

2. The method according to claim 1, wherein the calibration structure is located on the workpiece.

3. The method according to claim 1, wherein the calibration structure is arranged separately from the workpiece.

4. The method according to claim 1, wherein the calibration structure comprises one calibration structure of a plurality of calibration structures, and wherein calibration measured values are recorded for each of the plurality of calibration structures and are used to form the structure size measured values.

5. The method according to claim 4, wherein calibration measured values are recorded for a plurality of calibration structures of different size.

6. The method according to claim 5, wherein a calibration measured value of a calibration structure that is most similar in terms of size to the structure to be measured is in each case used to form the structure size measured value.

7. The method according to claim 5, wherein the calibration measured values are averaged, and the structure size measured value is formed using the mean value of the calibration measured values.

8. The method according to claim 1, wherein the structure size is measured of a structure that has been produced by means of an additional production mask on the workpiece.

9. The method according to claim 8, wherein the calibration preset value is determined on the basis of the production mask by measuring the calibration structure, the calibration structure being present on the production mask and wherein the resultant measured value is used as the calibration preset value.

10. The method according to claim 1, wherein a grid structure with at least two parallel grid bars, which each form one structure element, is used as the calibration structure.

11. The method according to claim 10, wherein the predetermined measurement direction runs at right angles to the longitudinal direction of the grid bars of the grid structure.

12. The method according to claim 1, wherein the calibration factor is determined for a predetermined measurement direction, and the auxiliary measured value is corrected for structures that extend along the predetermined measurement direction.

13. The method according to claim 1, wherein one calibration factor is determined for each of two mutually perpendicular measurement directions.

14. The method according to claim 1, wherein, if there are three or more measurement directions, they are arranged symmetrically.

15. The method according to claim 1, wherein one individual calibration structure is in each case used for each of the measurement directions.

16. The method according to claim 14, wherein:
   one individual grid structure having at least two parallel grid bars, which each form a structure element, is in each case used for each of the measurement directions; and
   with the measurement direction in each case running transversely with respect to the longitudinal direction of the grid bars of the associated grid structure.

17. The method according to claim 1, wherein the calibration preset value is predetermined and is fixed.

18. The method according to claim 1, wherein the calibration preset value is measured using a first test set, and the auxiliary measured value and the calibration measured value are measured using a second test set.

19. The method according to claim 17, wherein the first test set has a measurement accuracy and the second test set has a measurement accuracy and wherein the measurement accuracy of the first test set is more accurate than the measurement accuracy of the second test set.

20. The method according to claim 1, wherein the structure comprises a structure that is arranged on a semiconductor wafer.

21. A test set including a control device configured to carry out a measurement method to determine a structure size of a structure, wherein:
   the control device is configured to measure the structure size of the structure to determine an auxiliary measured value;
   the control device is configured to determine a calibration measured value on the basis of a calibration structure, the calibration structure including at least two structure elements at a distance from one another, the calibration measured value based on at least a measured value sum of the width of one of the two structure elements and a distance between the two structure elements;
   the control device is configured to determine a calibration factor based on the calibration measured value and a predetermined calibration preset value that relates to the calibration structure; and
   the control device is configured to correct the auxiliary measured value using the calibration factor, the size of the structure being determined from the corrected auxiliary measured value;
   wherein a calibration factor is determined for each of at least two different measurement directions; and
   wherein the auxiliary measured value is corrected taking account of the determined calibration factors and taking into account the amount by which the structure to be measured extends along the different measurement directions.

22. The test set according to claim 19, wherein the control device includes a microprocessor and a memory in which a control program is stored for carrying out the measurement method.

23. The test set according to claim 19, wherein the test set includes an input at which calibration preset values from another test set can be fed in.

* * * * *